United States Patent
Yoshino et al.

(10) Patent No.: US 12,417,997 B2
(45) Date of Patent: Sep. 16, 2025

(54) WIRE BONDING APPARATUS, METHOD FOR MANUFACTURE OF SEMICONDUCTOR DEVICE, AND SEMICONDUCTOR DEVICE

(71) Applicant: SHINKAWA LTD., Tokyo (JP)

(72) Inventors: Hiroaki Yoshino, Tokyo (JP); Shinsuke Tei, Tokyo (JP)

(73) Assignee: SHINKAWA LTD., Tokyo (JP)

(*) Notice: Subject to any disclaimer, the term of this patent is extended or adjusted under 35 U.S.C. 154(b) by 809 days.

(21) Appl. No.: 17/610,445

(22) PCT Filed: May 27, 2019

(86) PCT No.: PCT/JP2019/020960
§ 371 (c)(1),
(2) Date: Nov. 11, 2021

(87) PCT Pub. No.: WO2020/240674
PCT Pub. Date: Dec. 3, 2020

(65) Prior Publication Data
US 2022/0208721 A1   Jun. 30, 2022

(51) Int. Cl.
*H01L 23/00* (2006.01)
(52) U.S. Cl.
CPC .............. *H01L 24/78* (2013.01); *H01L 24/48* (2013.01); *H01L 24/85* (2013.01);
(Continued)
(58) Field of Classification Search
CPC ... H01L 2224/4807; H01L 2224/48096; H01L 2224/48245; H01L 2224/48453;
(Continued)

(56) References Cited

U.S. PATENT DOCUMENTS 6,001,724 A * 12/1999 Stansbury ............... H01L 24/11
257/784
6,180,891 B1 * 1/2001 Murdeshwar ........... H01L 24/85
361/776
(Continued)

FOREIGN PATENT DOCUMENTS

JP          04024934 A  *  1/1992  ............. H01L 24/78
JP       H04184947         7/1992
(Continued)

OTHER PUBLICATIONS

"International Search Report (Form PCT/ISA/210) of PCT/JP2019/020960," mailed on Jul. 2, 2021, with English translation thereof, pp. 1-3.
(Continued)

*Primary Examiner* — Teresa M. Arroyo
(74) *Attorney, Agent, or Firm* — JCIPRNET

(57) ABSTRACT

This wire bonding apparatus has a capillary, a movement mechanism moving the capillary, and a control unit controlling driving of the movement mechanism. The control unit at least causes execution of: a first process (trajectory a) of lowering the capillary, after a FAB is formed, to pressure bonding height at a first bonding point to form a pressure bonded ball and a column part at the first bonding point; a second process (trajectory b) of moving the capillary horizontally at the pressure bonding height after execution of the first process to scarp off the column part by the capillary; and a third process (trajectory c-k) of repeating a pressing operation at least once after execution of the second process, the pressing operation involving moving the capillary forward and lowering the capillary temporarily during movement so that the capillary presses down on a wire portion positioned over the pressure bonded ball.

1 Claim, 8 Drawing Sheets

(52) U.S. Cl.
CPC ............... *H01L 2224/4807* (2013.01); *H01L 2224/48096* (2013.01); *H01L 2224/48245* (2013.01); *H01L 2224/48453* (2013.01); *H01L 2224/48465* (2013.01); *H01L 2224/78303* (2013.01); *H01L 2224/78353* (2013.01); *H01L 2224/786* (2013.01); *H01L 2224/78824* (2013.01); *H01L 2224/85091* (2013.01); *H01L 2224/85986* (2013.01)

(58) Field of Classification Search
CPC . H01L 2224/48465; H01L 2224/78303; H01L 2224/78353; H01L 2224/786; H01L 2224/78824; H01L 2224/85091; H01L 2224/85986; H01L 2224/45015; H01L 2224/45144; H01L 2224/4809; H01L 2224/48451; H01L 2224/78301; H01L 2224/85045; H01L 2224/85181; H01L 2224/85205; H01L 24/45; H01L 24/78; H01L 24/48; H01L 24/85; H01L 2924/00014; H01L 2924/20751; H01L 2924/20752; H01L 2224/05599
See application file for complete search history.

(56) References Cited

U.S. PATENT DOCUMENTS

| | | | |
|---|---|---|---|
| 6,207,549 B1 * | 3/2001 | Higashi | H01L 24/11 438/615 |
| 6,260,753 B1 * | 7/2001 | Renard | H01L 24/13 228/180.5 |
| 7,748,599 B2 | 7/2010 | Arahata et al. | |
| 8,042,725 B2 | 10/2011 | Arahata et al. | |
| 2006/0054662 A1 * | 3/2006 | Nishimaki | H01L 24/78 228/103 |
| 2006/0175383 A1 * | 8/2006 | Mii | B23K 20/007 228/180.5 |
| 2007/0187467 A1 * | 8/2007 | Toyama | H01L 24/11 228/101 |
| 2010/0059574 A1 * | 3/2010 | Arahata | H01L 24/48 228/110.1 |

FOREIGN PATENT DOCUMENTS

| | | | | |
|---|---|---|---|---|
| JP | 05235002 A | * | 9/1993 | ............ H01L 24/11 |
| JP | 2010103542 | | 5/2010 | |
| JP | 4625858 | | 2/2011 | |
| JP | 2014140074 | | 7/2014 | |
| JP | 6067951 B1 | * | 1/2017 | ............ B23K 1/0016 |

OTHER PUBLICATIONS

"Office Action of Taiwan Counterpart Application", issued on Mar. 9, 2020, with English translation thereof, p. 1-p. 9.
"Office Action of China Counterpart Application", issued on May 29, 2024, with partial English translation thereof, pp. 1-10.

* cited by examiner

|  | BALL THICKNESS Bt (μm) | LOOP HEIGHT HL (μm) | PULL STRENGTH (gf) |
|---|---|---|---|
| LARGEST VALUE | 7.2 | 21.5 | 2.4 |
| SMALLEST VALUE | 6.6 | 19.8 | 2.0 |
| RANGE | 0.6 | 1.7 | 0.4 |
| AVERAGE VALUE | 6.9 | 20.5 | 2.2 |

WIRE BONDING APPARATUS, METHOD FOR MANUFACTURE OF SEMICONDUCTOR DEVICE, AND SEMICONDUCTOR DEVICE

CROSS-REFERENCE TO RELATED APPLICATION

This application is a 371 application of the International PCT application serial no. PCT/JP2019/020960, filed on May 27, 2019. The entirety of the above-mentioned patent application is hereby incorporated by reference herein and made a part of this specification.

TECHNICAL FIELD

The present specification discloses a wire bonding apparatus for connecting a first bonding point and a second bonding point provided on a mounted body to each other with a wire, a method for manufacture of a semiconductor device, and a semiconductor device.

BACKGROUND ART

In recent years, in accordance with increase in the level of functionality of portable information terminals, digital AV instruments, IC cards, and the like, mounted semiconductor chips have been required to be smaller and thinner and have a higher level of integration. Particularly, in laminated memory devices or the like, memory capacities thereof are determined depending on the number of chips which can be laminated. For this reason, it is important to be able to laminate a larger number of semiconductor chips within a prescribed package height. In order to satisfy such a demand, it is necessary to restrict the heights of wire loops formed through wire bonding. Hence, in the related art, many low looping technologies for restricting the loop height have been proposed.

Here, a pressure bonded ball having a flat disk shape and a column part overlapping the pressure bonded ball are present at one end of a wire connecting a first bonding point and a second bonding point to each other. In many low looping technologies in the related art, since looping is performed in a state in which a column part remains on a pressure bonded ball as it stands, it is difficult to sufficiently reduce the loop height.

Here, Patent Literature 1 discloses a wire bonding method in which low looping can be formed. Specifically, in Patent Literature 1, a first step in which a side surface of an upper part (column part) of a pressure bonded ball is pressurized and a head top part of the pressure bonded ball is formed by raising a capillary and then moving the capillary to a second bonding point side after a pressure bonded ball having a desired pressure bonding thickness is formed by pressure-bonding a free air ball at a tip of the capillary at a first bonding point, and a second step in which a wire is pressurized from obliquely above by raising the capillary and causing it to descend while moving the capillary to a second bonding point side after the first step are executed. According to this technology of Patent Literature 1, since a portion of the upper part (column part) of the pressure bonded ball is crushed using a capillary, the loop height can be reduced to a certain extent.

CITATION LIST

Patent Literature

[Patent Literature 1]
Japanese Patent No. 4625858

SUMMARY OF INVENTION

Technical Problem

However, in the technology of Patent Literature 1, since only a portion of a column part can be crushed, it is difficult to sufficiently reduce the loop height. Hence, the present specification discloses a wire bonding apparatus with which the loop height can be further reduced, a method for manufacture of a semiconductor device, and a semiconductor device.

Solution to Problem

A wire bonding apparatus disclosed in the present specification is a wire bonding apparatus for connecting a first bonding point and a second bonding point provided on a mounted body to each other with a wire. The wire bonding apparatus includes a capillary which holds the wire, a movement mechanism which moves the capillary with respect to the mounted body, and a control unit which controls driving of the movement mechanism. The control unit executes at least a first process in which a pressure bonded ball and a column part positioned over the pressure bonded ball are formed at the first bonding point by causing the capillary to descend to a prescribed pressure bonding height toward the first bonding point after a free air ball is formed at a tip of the wire; a second process in which the column part is scraped off using the capillary by horizontally moving the capillary at the pressure bonding height after execution of the first process; and a third process in which the capillary is moved in a forward direction that is a direction of approaching the second bonding point at a movement height higher than the pressure bonding height, and a pressing operation of causing the capillary to temporarily descend such that a wire portion overlapping the pressure bonded ball is pressed down using the capillary is repeated at least once during movement after execution of the second process.

In the case of the constitution, the column part is scraped using the capillary, and the wire portion overlapping the pressure bonded ball is pressed down using the capillary. Therefore, the loop height can be further reduced.

In this case, in the second process, the control unit may cause the capillary to horizontally move in a reverse direction that is a direction of separating from the second bonding point.

In addition, in the second process, the control unit may cause the capillary to horizontally move by a distance which is at least a diameter of the column part or longer.

According to the constitution, the column part can substantially certainly be scraped.

In addition, in the third process, the control unit may cause the pressing operation to be performed twice or more while a horizontal position of the capillary is changed such that the wire portion overlapping the pressure bonded ball is thoroughly pressurized using the capillary.

According to the constitution, not only the thickness of a first bonded part but also the loop height can be further reduced.

In addition, the control unit may generate a movement sequence of the capillary based on shape information of the capillary, target shape information of the pressure bonded ball, and information of the wire.

According to the constitution, trouble of an operator can be reduced.

A method for manufacture of a semiconductor device according to another aspect of the present invention is a method for manufacture of a semiconductor device in which a semiconductor device is manufactured by connecting a first bonding point and a second bonding point to each other with a wire using a capillary. The method includes a first step in which a pressure bonded ball and a column part positioned over the pressure bonded ball are formed at the first bonding point by causing the capillary to descend to a prescribed pressure bonding height toward the first bonding point after a free air ball is formed at a tip of the wire inserted through the capillary; a second step in which the column part is scraped off using the capillary by horizontally moving the capillary at the pressure bonding height after execution of the first step; and a third step in which the capillary is moved in a forward direction that is a direction of approaching the second bonding point at a movement height higher than the pressure bonding height, and a pressing operation for causing the capillary to ascend and descend such that a wire portion overlapping the pressure bonded ball is pressed down using the capillary is repeated at least once during movement after execution of the second step.

In the case of the constitution, the column part is scraped using the capillary, and the wire portion overlapping the pressure bonded ball is pressed down using the capillary. Therefore, the loop height can be further reduced.

A semiconductor device according to another aspect of the present invention is a semiconductor device in which a first bonding point on a semiconductor chip and a second bonding point on a lead frame having the semiconductor chip mounted thereon are connected to each other with a wire loop. The wire loop has a first bonded part which is formed at the first bonding point, and a second bonded part which is formed at the second bonding point and is connected to the first bonded part via the wire. The first bonded part has a shape in which a portion of the wire crushed toward a pressure bonded ball having a flat disk shape is placed at a predetermined interval on the pressure bonded ball. The wire is substantially horizontally drawn out from an end part of the first bonded part.

A portion of the crushed wire is directly placed on the pressure bonded ball. Therefore, not only the thickness of the first bonded part but also the loop height can be reduced, and the thickness of the semiconductor device can be further reduced.

In this case, a loop height that is a distance from an upper surface of the semiconductor chip to a highest point of the wire loop may be smaller than a total value of a thickness of the pressure bonded ball and a diameter of the wire or may be the same as the total value.

According to the constitution, not only the thickness of the first bonded part but also the loop height can be reduced, and the thickness of the semiconductor device can be further reduced.

Advantageous Effects of Invention

According to the wire bonding apparatus, the method for manufacture of a semiconductor device, and the semiconductor device disclosed in the present specification, the column part is scraped using the capillary, and the wire portion overlapping the pressure bonded ball is pressed down using the capillary. Therefore, the loop height can be further reduced.

DESCRIPTION OF EMBODIMENT

Figure 1:
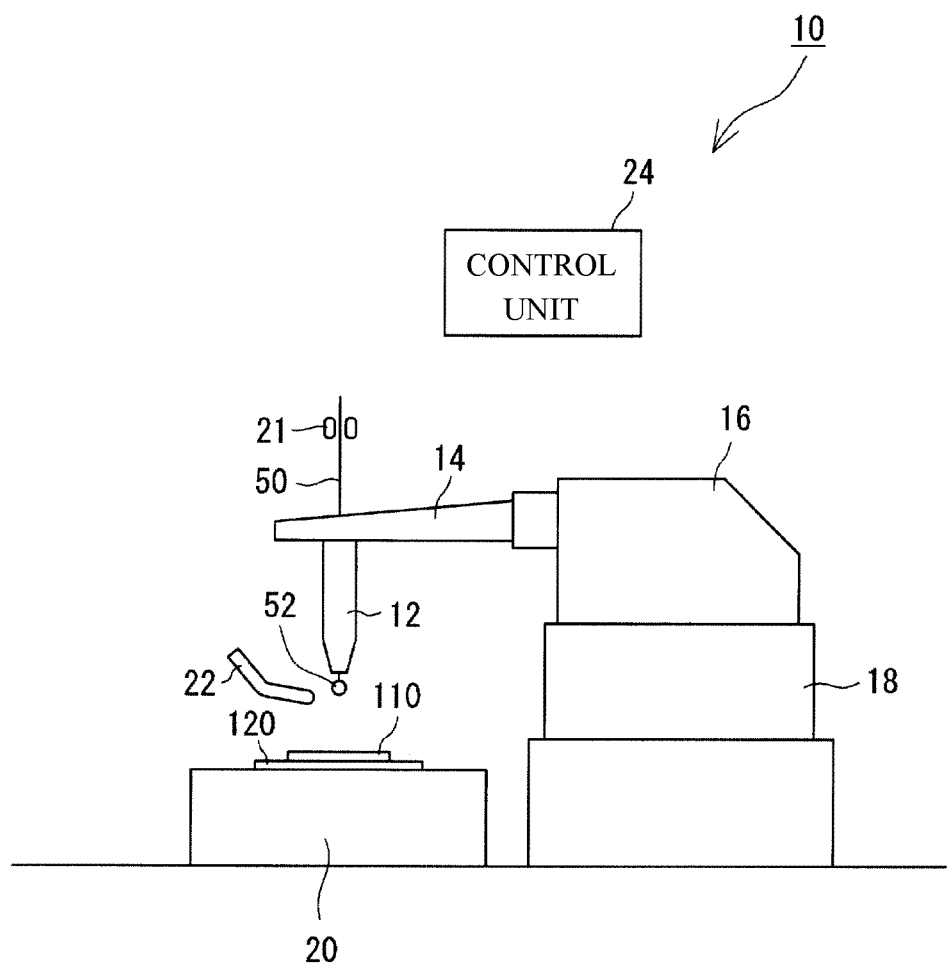
FIG. 1 is a view illustrating a constitution of a wire bonding apparatus.

Hereinafter, a constitution of a wire bonding apparatus 10 will be described with reference to the drawings. FIG. 1 is a view illustrating a constitution of the wire bonding apparatus 10. This wire bonding apparatus 10 is a device connecting a first bonding point P1 and a second bonding point P2 to each other with a wire 50. Generally, the first bonding point P1 is set on a pad 112 of a semiconductor chip 110, and the second bonding point P2 is set on a lead 122 of a lead frame 120 having the semiconductor chip 110 mounted thereon.

The wire bonding apparatus 10 includes a bonding head 16 and a stage 20 on which the lead frame 120 having the semiconductor chip 110 mounted thereon (both will hereinafter be collectively referred to as "a mounted body") is placed. The bonding head 16 further includes a bonding arm 14 which functions as an ultrasonic horn and a capillary 12 which is attached to a tip of the said bonding arm 14. The bonding arm 14 is an arm protruding from the bonding head 16 in a horizontal direction, and an ultrasonic vibrator is embedded thereinto. Ultrasonic vibration can be applied to the capillary 12 positioned at the tip of the bonding arm 14 by applying a voltage to this ultrasonic vibrator using an ultrasonic wave oscillator (not illustrated) provided in the wire bonding apparatus 10.

The capillary 12 is attached to the tip of the bonding arm 14 such that it vertically faces the stage 20. A penetration hole (which will hereinafter be referred to as "a hole 40" and is not illustrated in FIG. 1) penetrating the capillary 12 in an axial direction is formed therein, and the wire 50 such as a gold wire is inserted through this hole 40. The capillary 12 is suitably replaced in accordance with the kind of the used wire 50, the shape of a required pressure bonded ball 60, or the like.

A discharge electrode 22 is disposed in the vicinity of the capillary 12. The discharge electrode 22 is provided at a tip of the wire 50 to form a free air ball (which will hereinafter be referred to as "a FAB 52") which is realized when the said wire 50 melts. When a high voltage is applied between this discharge electrode 22 and the tip of the wire to generate a discharge, the tip part of the wire 50 melts due to the discharge energy thereof. Further, the FAB 52 is formed at the tip of the wire 50 due to this melting.

A clamper 21 is arranged above the capillary 12. The clamper 21 has a pair of grip members arranged on both sides of the wire 50 and sandwiches or releases the wire 50 by causing these grip members to become closer to or separate from each other.

The bonding arm 14 is attached to the bonding head 16 via an ascending/descending mechanism (not illustrated). In addition, the bonding head 16 is installed in an XY table 18 and can move in the horizontal direction. Further, the capillary 12 can relatively move in the horizontal direction and a vertical direction with respect to a mounted body in accordance with horizontal movement of the bonding head 16 and vertical movement of the bonding arm 14. Namely, the ascending/descending mechanism and the XY table 18 function as a movement mechanism for relatively moving the capillary 12 with respect to the mounted body. In the present example, the capillary 12 is moved, but a constitution in which the stage 20 is moved instead of the capillary 12 may be adopted.

A mounted body that is the lead frame 120 having the semiconductor chip 110 mounted thereon is placed on the stage 20. A heater (not illustrated) for heating the lead frame 120 is built into this stage 20. When wire bonding is executed, the lead frame 120 is heated by this heater.

A control unit 24 controls driving of each part of the wire bonding apparatus 10. For example, the control unit 24 includes a memory which stores various kinds of data and a CPU which performs various kinds of computation. Data stored in the memory of the control unit 24 includes a control program for executing a bonding process and data and the like necessary to generate a movement sequence of the capillary 12, which will be described below.

Specifically, the control unit 24 controls the position of the capillary 12 with respect to the mounted body by controlling driving of the XY table 18 and the ascending/descending mechanism. In addition, the control unit 24 also performs opening/closing control of the clamper 21, applying control of a discharge voltage, and driving control of the heater of the stage 20 in accordance with the state of progress of the bonding process. In addition, the control unit 24 also functions as a generation part which generates a movement sequence of the capillary 12 (a driving sequence of the XY table 18 and the ascending/descending mechanism). In order to generate a movement sequence, information related to the shape of the capillary 12, target shape information related to the pressure bonded ball 60 (which will be described below), and the like are stored in the memory of the control unit 24, and this will be described below.

Figure 2:
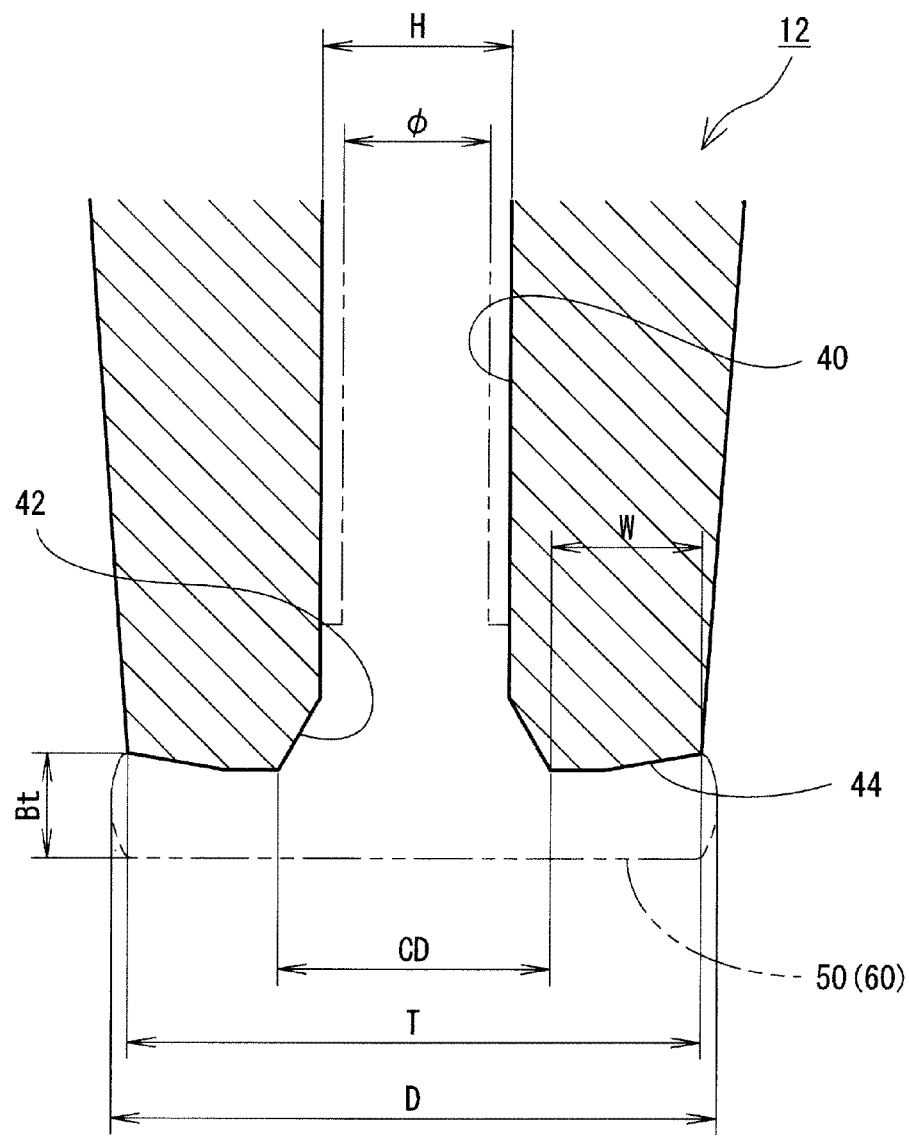
FIG. 2 is a view illustrating a shape of a tip of a capillary.

FIG. 2 is a view illustrating an example of the tip part of the capillary 12. The hole 40 that is a penetration hole penetrating the capillary 12 in its axial direction is formed therein. The wire 50 is inserted through the inside of the hole 40. Therefore, a diameter of the hole 40 (hole diameter H) is larger than the diameter of the wire 50 (wire diameter φ) (H>φ). A lower end of the hole 40 expands in a conical shape. A tapered surface expanding in this conical shape will be referred to as a chamfered surface 42. In addition, the largest diameter (that is, the diameter at the lowermost end) in a space of this conical shape will be referred to as a chamfer diameter CD.

A lower end surface of the capillary 12 becomes a facing surface 44 which pressurizes the FAB 52. This facing surface 44 may be a flat horizontal surface or may be an inclined surface advancing upward going closer to the outward side. The width of the facing surface 44, that is, a distance from an inner circumferential edge at the lower end of the hole 40 to an outer circumferential edge at the lower end of the capillary 12 will hereinafter be referred to as "a facing width W". When the outer diameter of the capillary 12 is T, the facing width W is expressed by W=(T−CD)/2.

Figure 3:
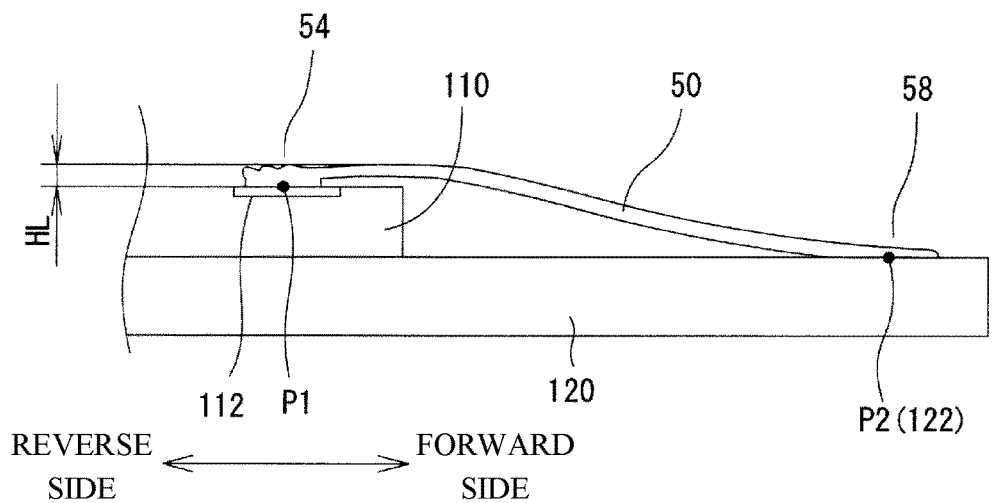
FIG. 3 is a view illustrating an example of a shape of a wire loop.

FIG. 3 is an image view of a wire loop formed by the wire bonding apparatus 10. A plurality of pads 112 is arranged in the semiconductor chip 110, and a plurality of leads 122 is arranged in the lead frame 120. The wire bonding apparatus 10 connects the first bonding point P1 positioned over this pad 112 and the second bonding point P2 positioned over the lead 122 to each other with the wire 50.

A first bonded part 54 which is formed by pressing one end of the wire 50 to the pad 112 is formed at the first bonding point P1, and the wire 50 drawn out from this first bonded part 54 extends to the second bonding point P2. A second bonded part 58 which is formed by pressing the other end of the wire 50 to the lead 122 is formed at the second bonding point P2. Here, normally, the second bonded part 58 is a stitch bond realized by pressing and crushing the wire 50 against the lead 122.

In order to reduce the thickness of a semiconductor device, there is a need to reduce the height of this wire loop, particularly a distance from an upper surface of the pad 112 to the uppermost point of the wire loop in the vertical direction, that is, a loop height HL. In the present specification, in order to reduce this loop height HL, the first bonded part 54 is formed through a special step. This will be described in comparison with a technology in the related art. In the following description, when viewed from the first bonding point P1, a direction of approaching the second bonding point P2 will be referred to as "a forward direction", and a direction of separating from the second bonding point P2 will be referred to as "a reverse direction".

Figure 9:
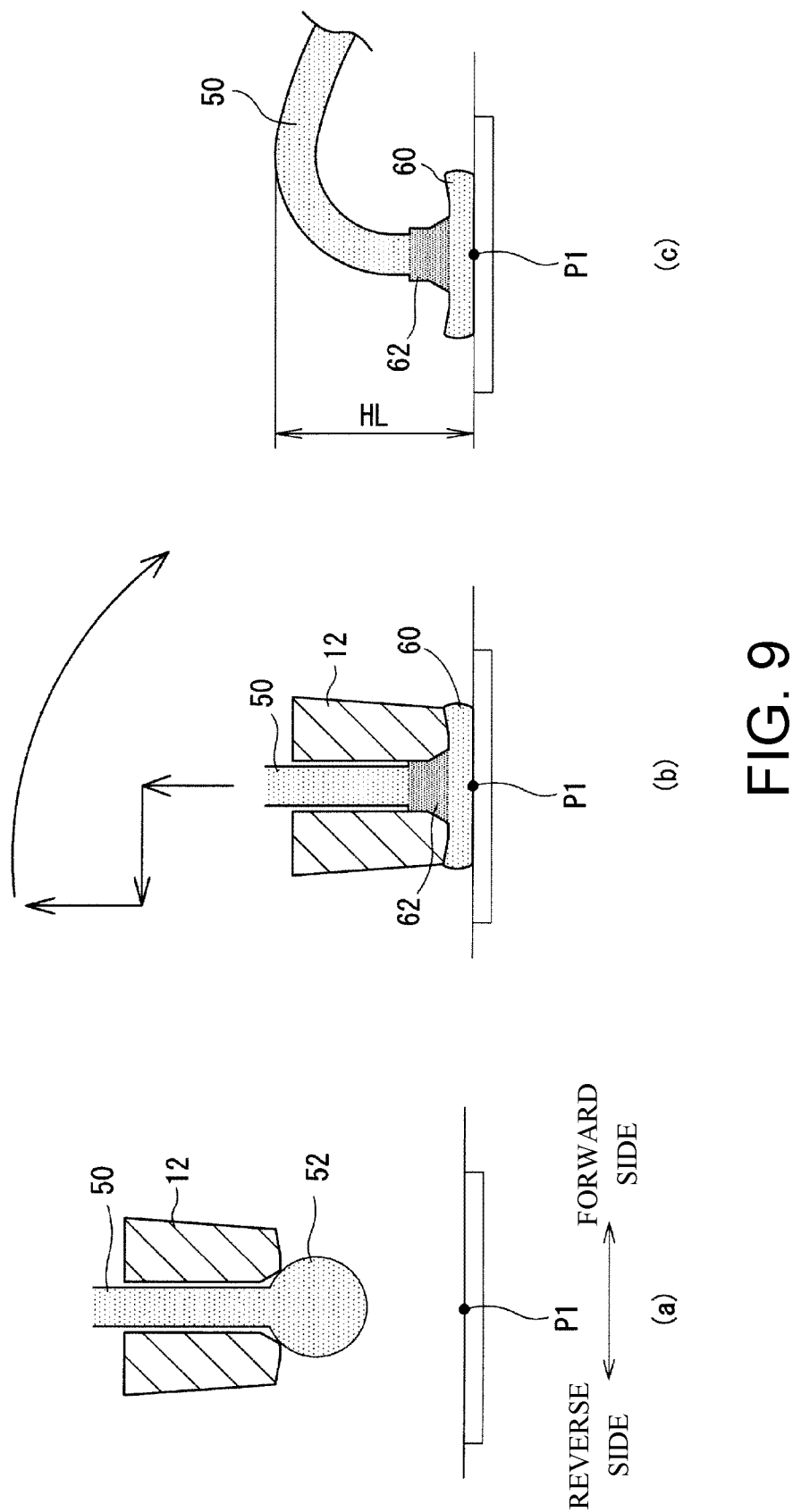
FIG. 9 is a view illustrating a situation in which a first bonded part in the related art is formed.

First, formation of the first bonded part 54 in the related art will be simply described. FIG. 9 is an image view illustrating a flow of formation of the first bonded part 54 in the related art. When the first bonded part 54 is formed, first, the pressure bonded ball 60 is formed at the first bonding point P1 positioned over the pad 112 of the semiconductor chip 110. Specifically, first, as illustrated in FIG. 9(a), the FAB 52 is formed at the tip of the wire 50. Subsequently, as illustrated in FIG. 9(b), the capillary 12 is caused to descend toward the first bonding point P1, and the FAB 52 is pressurized to the first bonding point P1 by the facing surface 44 of the capillary 12. At the time of this pressurization, vibration may be applied to the capillary 12 via the bonding arm 14. In accordance with this pressurization, the FAB 52 is deformed flat, and the pressure bonded ball 60 having a flat disk shape is formed on the pad 112. In addition, a portion of a material constituting the FAB 52 fills the inside of the hole 40 of the capillary 12. The material filling the inside of this hole 40 constitutes a column part 62 having a smaller diameter than the pressure bonded ball 60 and a larger diameter than the wire 50. Further, due to this pressurization, the first bonded part 54 in which the column part 62 is placed on the pressure bonded ball 60 having a flat disk shape is formed at the first bonding point P1.

If the first bonded part 54 is formed, the control unit 24 causes the capillary 12 to move such that the wire 50 loops toward the second bonding point P2. Specifically, as indicated by the arrows in FIG. 9(b), the control unit 24 causes the capillary 12 to move in the upward direction, the reverse direction, and the upward direction, imparts a bending habit to the wire 50, and then causes the capillary 12 to move to the second bonding point P2. Further, at the second bonding point P2, the second bonded part 58 (stitch bond) of the crushed wire 50 is formed by pressing the capillary 12 to the lead 122. If the second bonded part 58 is formed, the control unit 24 causes the capillary 12 to move upward, and then causes the capillary 12 to further move in the upward direction in a state in which the clamper 21 is closed such that the wire 50 is torn off.

As in FIG. 9(c), around the first bonded part 54 formed by the foregoing procedure, the wire 50 has a shape extending upward from an upper end of the first bonded part 54, and then extending in an obliquely downward direction while forming a gentle arc. In this case, the loop height HL is the total of the thickness of the pressure bonded ball 60, the thickness of the column part 62, and the height of the wire 50 drawn out substantially in a U-shape from the column part 62. This loop height HL has been comparatively high, which is twice to four times the wire diameter φ. Such a large loop height HL has hindered not only thickness reduction of semiconductor devices but also size reduction, thickness reduction, and high integration of semiconductor devices.

Figure 10:
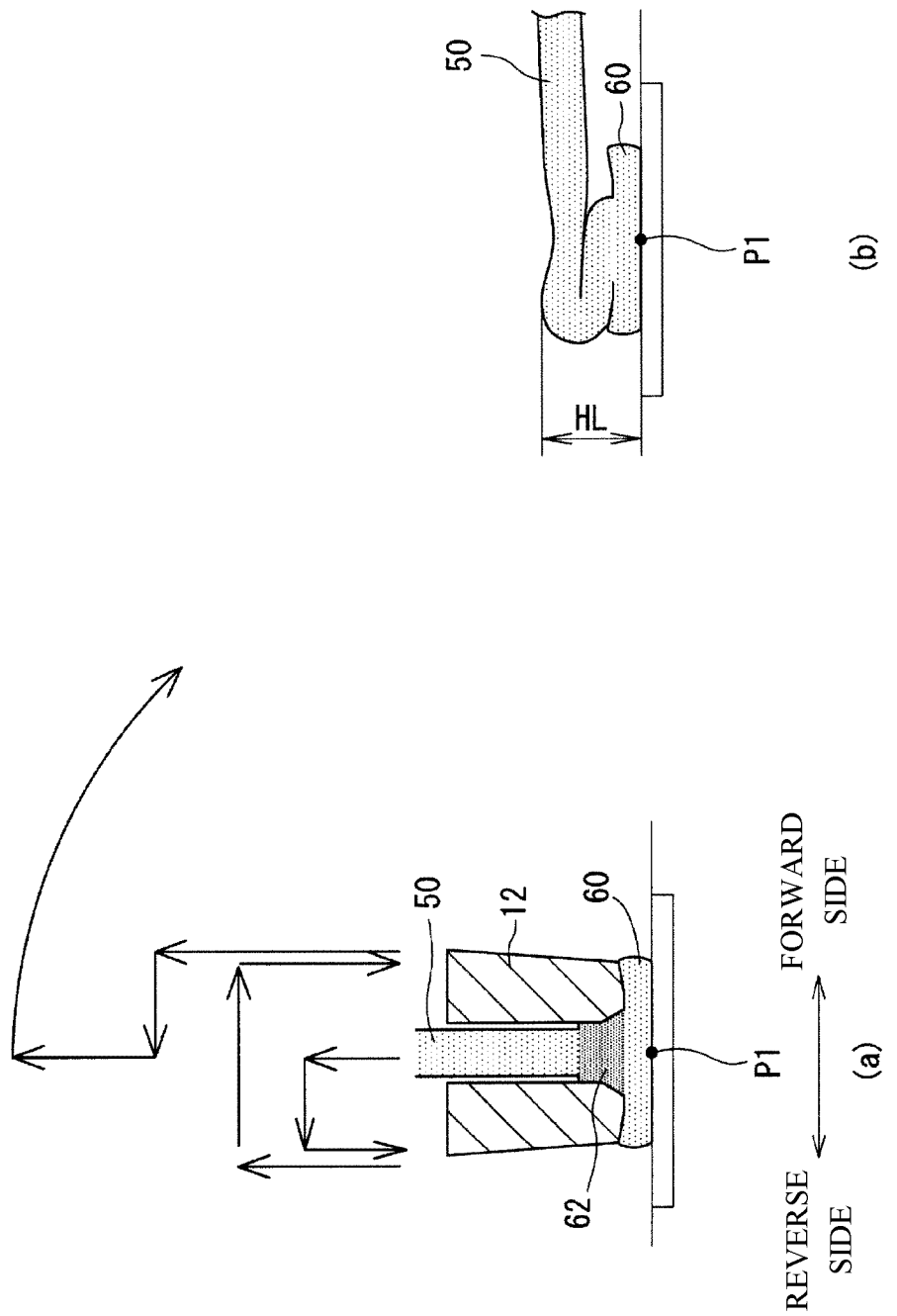
FIG. 10 is a view illustrating another situation in which the first bonded part in the related art is formed.

Hence, in the related art, a low looping technology in which the loop height HL can be further reduced has been examined. For example, as illustrated in FIG. 10, a technology in which the pressure bonded ball 60 is formed at the first bonding point P1, the wire 50 is thereafter folded back on the said pressure bonded ball 60, and then this folded back wire is pressurized using the capillary 12 has been proposed in the related art. Specifically, if the pressure bonded ball 60 and the column part 62 are formed, as indicated by the arrows in FIG. 10(a), the control unit 24 causes the capillary 12 to move in the upward direction, the reverse direction, the downward direction, and the upward direction. Thereafter, the capillary 12 is moved in the forward direction again. At that spot, once again it is moved in the downward direction. Accordingly, the wire 50 is folded back on the pressure bonded ball 60. Further, thereafter, similar to a normal looping operation, the capillary 12 is moved in the upward direction, the reverse direction, and the upward direction. After a bending habit is imparted thereto, the capillary 12 is moved to the second bonding point P2.

According to the technology, the wire 50 extends substantially in a horizontal direction without vertically rising from the first bonded part 54. Therefore, compared to the technology illustrated in FIG. 9, the loop height HL can be reduced. However, in this technology, the column part 62 lies on its side, and the wire 50 is placed on this lying column part 62. Although this column part 62 and the wire 50 are pressurized by the capillary 12, it is difficult to sufficiently reduce the height thereof by simply pressurizing these. Particularly, the column part 62 is harder than other portions due to work hardening caused when the pressure bonded ball 60 is formed. It is difficult to sufficiently reduce the thickness of the column part 62 by simply pressurizing it using the capillary 12. As a result, the loop height HL according to the technology in FIG. 10 is often approximately the total of a thickness Bt of the pressure bonded ball 60 and the wire diameter φ. For example, when the wire diameter is 18 μm and the thickness Bt of the pressure bonded ball 60 is 7μm, the loop height HL according to the technology in FIG. 10 is approximately 25 μm.

Figure 4:
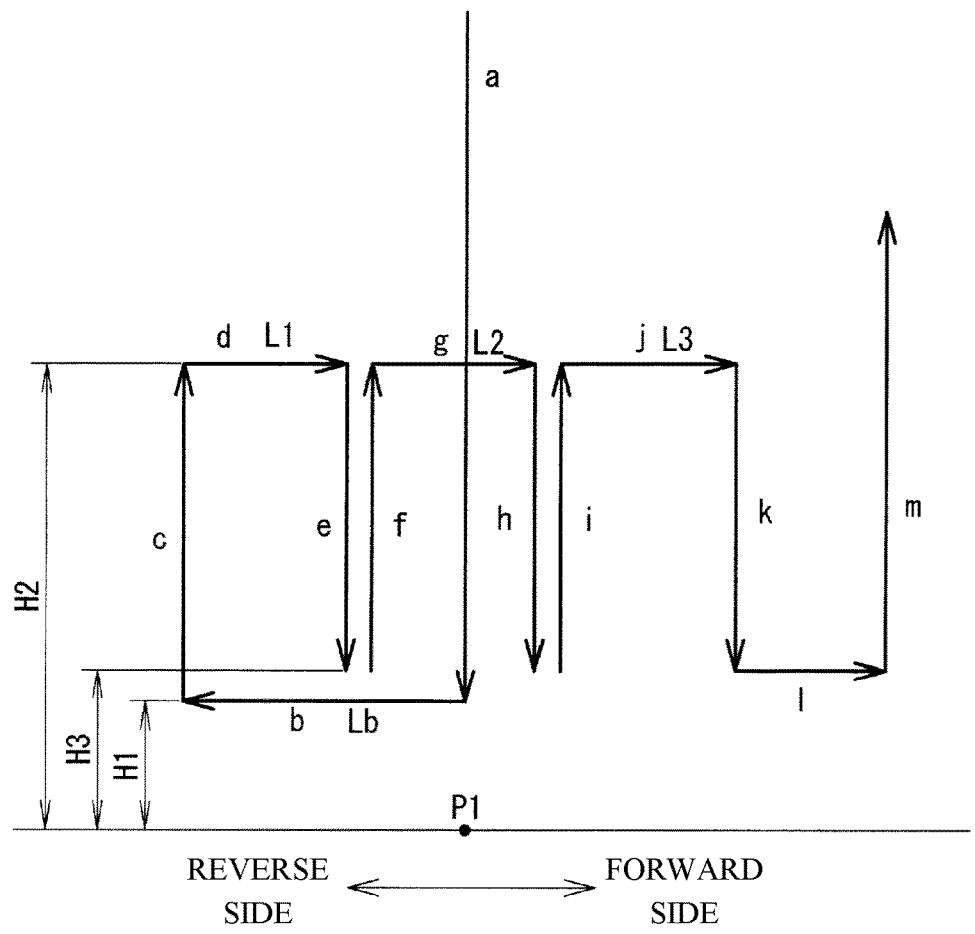
FIG. 4 is a view illustrating a movement trajectory of the capillary.
Figure 5:
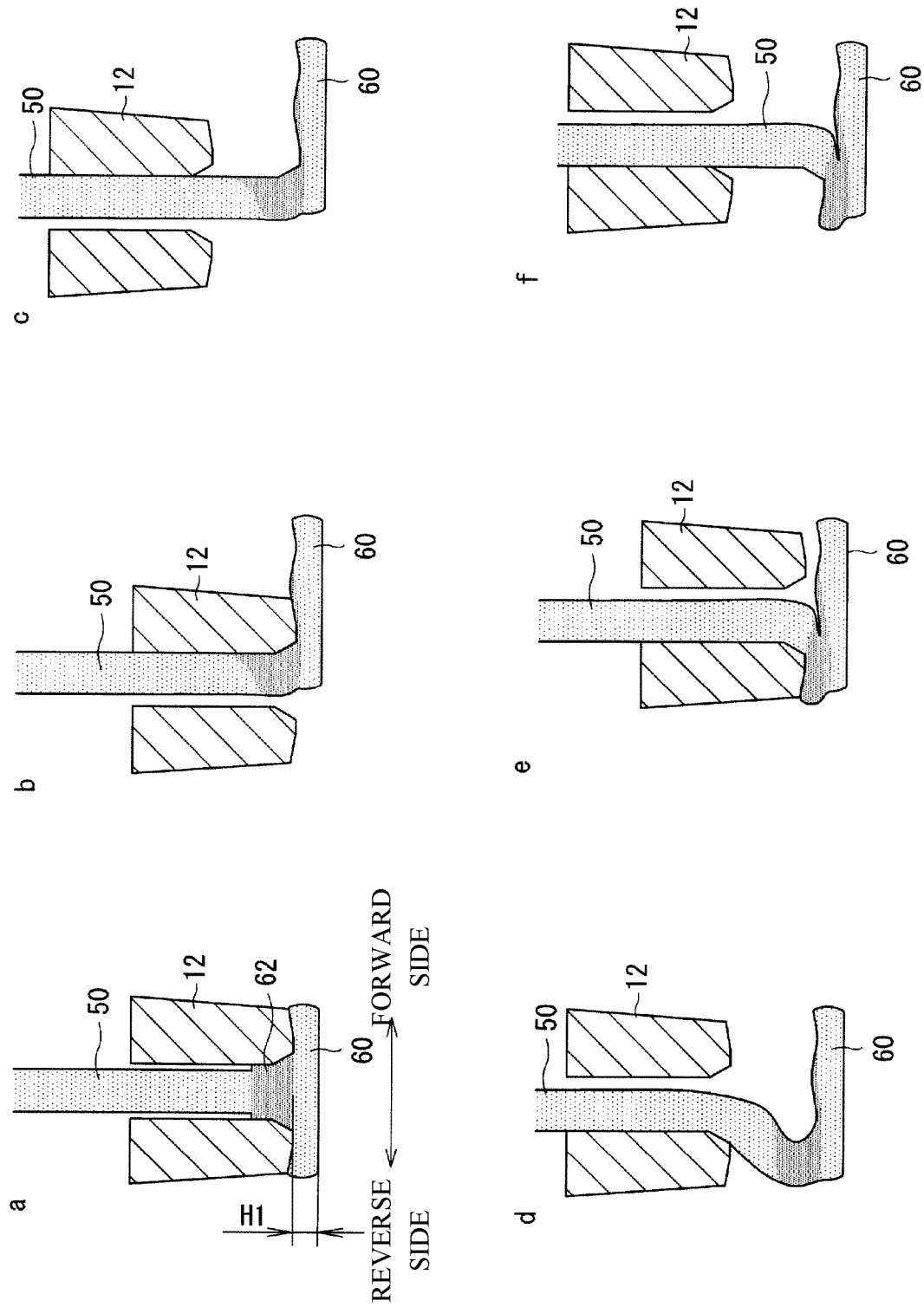
FIG. 5 is a view illustrating a situation at the time of forming a first bonded part.
Figure 6:
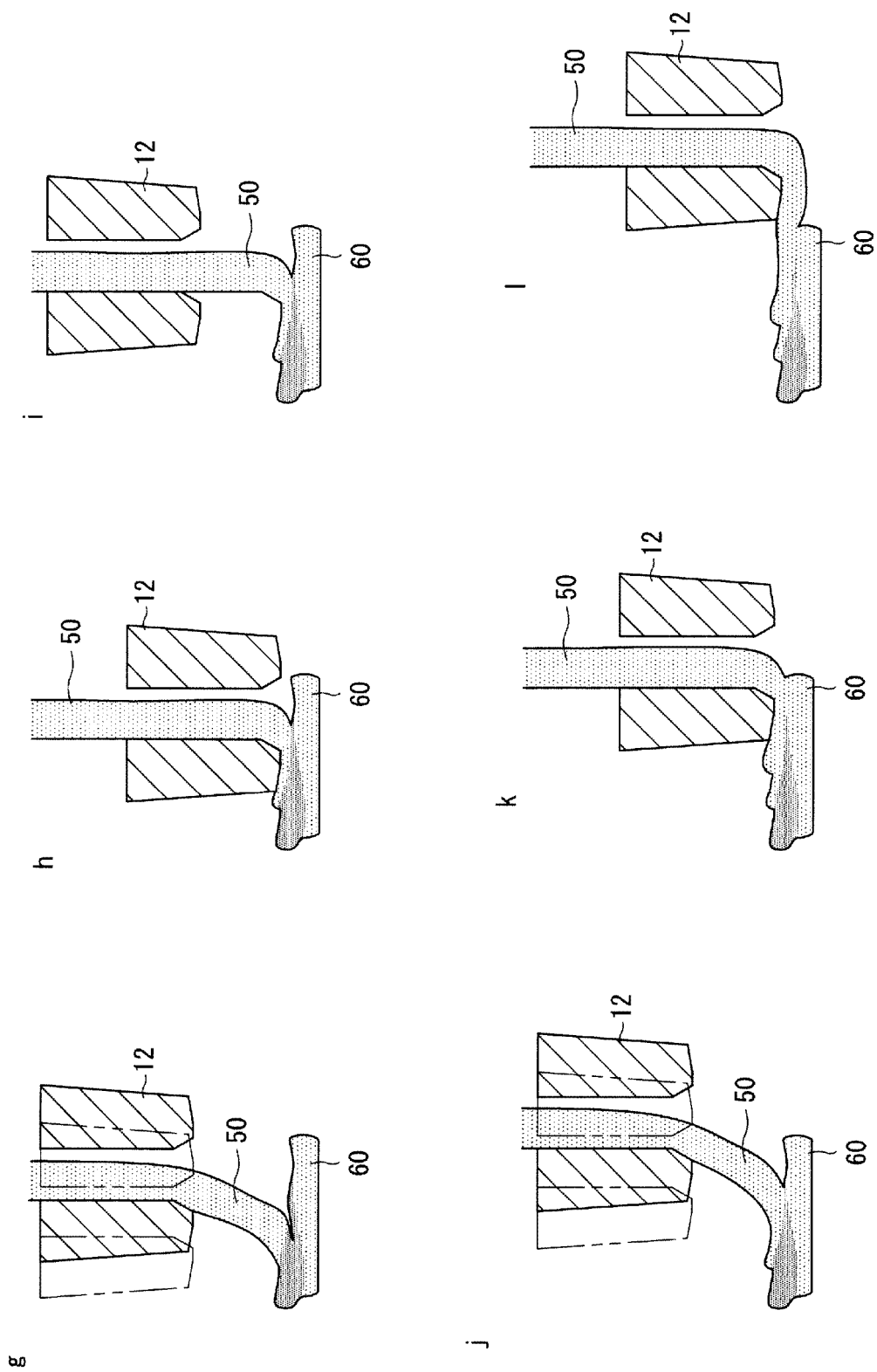
FIG. 6 is a view illustrating another situation at the time of forming the first bonded part.

In the wire bonding apparatus 10 disclosed in the present specification, the loop height HL is further reduced. Specifically, in this device, after the pressure bonded ball 60 and the column part 62 are formed, the column part 62 is scraped using the capillary 12 by horizontally moving the capillary 12 as it stands without moving it upward. Accordingly, low looping is achieved. This will be described with reference to FIGS. 4 to 6. FIG. 4 is a view illustrating a movement trajectory of the capillary 12 at the time of forming the first bonded part 54. In addition, FIGS. 5 and 6 are views illustrating movement of the capillary 12 and the wire 50 when the first bonded part 54 is formed. The alphabets a to l applied in each diagram of FIGS. 5 and 6 correspond to trajectories a to m indicated in FIG. 4.

When the first bonded part 54 is formed, the control unit 24 first releases the clamper 21. In this state, driving control of the XY table 18 and the ascending/descending mechanism is performed, and the capillary 12 is moved to a place immediately above the first bonding point P1. Subsequently, the control unit 24 causes a high voltage to be applied between the discharge electrode 22 and the tip of the wire 50 to generate a discharge, and the FAB 52 is formed at the tip of the wire 50.

If the FAB 52 is formed, the control unit 24 causes the capillary 12 to descend toward the first bonding point P1. At this time, a distance from the upper surface of the pad 112 to the lower end of the capillary 12 (which will hereinafter be referred to as "a pressure bonding height H1") is determined based on a target value of the thickness Bt of the pressure bonded ball 60.

The trajectory a in FIG. 4 indicates a trajectory when this capillary 12 is caused to descend to the pressure bonding height H1. In addition, the diagram at the left end in the upper stage in FIG. 5 illustrates a situation of the capillary 12 and the wire 50 in this trajectory a. In addition, at the time of this descending, ultrasonic vibration may be applied to the capillary 12 via the bonding arm 14.

In accordance with descending of the capillary 12, the FAB 52 is pressurized and becomes flat by the facing surface 44 of the capillary 12. In addition, a portion of a material constituting the FAB 52 fills the inside of the hole 40 of the capillary 12. As a result, as illustrated at the left end in the upper stage in FIG. 5, the pressure bonded ball 60 having a flat disk shape and the column part 62 placed on the said pressure bonded ball 60 are formed at the first bonding point P1. The step and the process of forming this pressure bonded ball 60 and the column part 62 are a first step and a first process.

If the pressure bonded ball 60 is formed, subsequently, the control unit 24 causes the capillary 12 to horizontally move at the pressure bonding height H1 such that the column part 62 is scraped off using the capillary 12. Specifically, as indicated by the trajectory b in FIG. 4, the control unit 24 causes the capillary 12 to horizontally move in the reverse direction without raising the capillary 12, in other words, while maintaining a state in which the column part 62 is present inside the hole 40 of the capillary 12. The diagram at the center in the upper stage in FIG. 5 is a view illustrating a situation at this time. In this case, naturally, an inner circumferential surface of the hole 40 and the column part 62 interfere with each other. When the capillary 12 horizontally moves while interfering with the column part 62, the column part 62 is scraped by the capillary 12. As indicated by darker hatching at the center in the upper stage in FIG. 5, a portion of the material of the scraped column part 62 escapes in a lateral direction, and other portions escape into the hole 40. In any case, when the capillary 12 horizontally moves without rising after the pressure bonded ball 60 is formed, the column part 62 is scraped off. The step and the process of scraping off this column part 62 correspond to a second step and a second process.

Here, a distance of horizontal movement of this capillary 12 (movement distance of the trajectory b) is not particularly limited. However, an objective of this second step (trajectory b) is to scrape the column part 62. Therefore, in the said second step, it is desirable that the capillary 12 be horizontally moved by a distance which is the diameter of the column part 62 or longer. In addition, the direction of horizontal movement of the capillary 12 may be the reverse direction or may be the forward direction as long as the column part 62 can be scraped off. In addition, the capillary 12 may move forward and rearward at least once in the reverse direction and the forward direction as long as the column part 62 can be scraped off. In addition, in order to smoothly perform this scraping-off operation, ultrasonic vibration may be applied to the capillary 12 during movement in the trajectory b.

If the second step ends, the control unit 24 subsequently executes a third step (third process) in which the capillary 12 is moved in the forward direction at a movement height H2 higher than the pressure bonding height H1 and a pressing operation of causing the capillary 12 to ascend and descend during the movement is repeated at least once. The trajectory c to the trajectory k indicate movement trajectories of the capillary 12 in this third step. In addition, the diagrams from the right end in the upper stage in FIG. 5 to the center in the lower stage in FIG. 6 indicate situations of this third step.

Specifically, if the column part 62 is scraped off, the control unit 24 causes the capillary 12 to move upward (trajectory c) and then to move to the forward side by a predetermined distance (trajectory d). Accordingly, as illustrated at the right end in the upper stage and the left end in the lower stage in FIG. 5, the wire 50 is folded back to the forward side and is placed on the pressure bonded ball 60. In this state, the control unit 24 causes the capillary 12 to move downward (trajectory e), and as illustrated at the center in the lower stage in FIG. 5, causes the wire 50 on the pressure bonded ball 60 to be pressed down by the facing surface 44 of the capillary 12. Accordingly, a portion of the material of the trampled wire 50 escapes to the outward side of the capillary 12, and other portions escape into the hole 40 of the capillary 12. On the other hand, the thickness of the first bonded part 54 immediately below the facing surface 44 is drastically reduced.

Here, this folded back wire portion includes the material constituting the column part 62 (darker hatching spot). As described above, the column part 62 is harder than those at other spots. For this reason, the original column part 62 is not easily deformed and the thickness thereof is also not easily reduced by simply pressing down the column part 62 using the capillary 12. However, at this time, the column part 62 has been scraped and destroyed by the capillary 12. For this reason, it is easily deformed and the thickness thereof is also reduced by pressing down the column part 62 using the capillary 12.

When the wire 50 is pressed down by the facing surface 44, ultrasonic vibration may be applied to the capillary 12. In any case, an operation of causing the capillary 12 to temporarily descend (an operation in the trajectory e, h, or k) in this manner will hereinafter be referred to as "a pressing operation".

The control unit 24 repeats this pressing operation a plurality of times while a horizontal position is changed until the wire 50 arrives at a forward side end part of the pressure bonded ball 60. In the present example, the control unit 24 performs the pressing operation three times. The trajectory e in FIG. 4 and the diagram at the center in the lower stage in FIG. 5 illustrate a first pressing operation. In addition, the trajectory h in FIG. 4 and the diagram at the center in the upper stage in FIG. 6 illustrate a second pressing operation, and the trajectory k in FIG. 4 and the diagram at the center in the lower stage in FIG. 6 illustrate a third pressing operation. As is obvious in FIGS. 5 and 6, the wire 50 can be drawn out from the forward side end part of the pressure bonded ball 60 while the thickness of the first bonded part 54 is maintained thin by repeating the pressing operation until the wire 50 arrives at the forward side end part of the pressure bonded ball 60.

Here, it is desirable that the number of times of performing this pressing operation and horizontal intervals (distances of the trajectories d, g, and j) be set such that the entire wire 50 placed on the pressure bonded ball 60 is thoroughly pressed down by the facing surface 44 on the reverse side of the hole 40.

In addition, the movement height H2 is set within a range in which the wire 50 can be folded back. That is, if the movement height H2 is excessively smaller than the wire diameter 9, the wire 50 is unlikely to lie, and thus the wire 50 cannot be folded back. On the other hand, if the movement height H2 is larger than necessary, it takes extra time for the increased portion. Hence, it is desirable that an appropriate value for the movement height H2 corresponding to the diameter or the material of the used wire 50 be obtained in advance through an experiment or the like and be stored in the control unit 24.

It is desirable that the height of the capillary 12 at the time of pressing down, that is, a pressing height H3 be substantially the same as the pressure bonding height H1. However, actually, it is difficult to realize H3=H1 due to a resistance or the like from the wire 50 pressed down by the capillary 12. Actually, H3<H1 is realized. A difference ΔH between the pressing height H3 and the pressure bonding height H1 significantly affects the thickness of the first bonded part 54. For this reason, it is desirable that an appropriate value for the difference ΔH be obtained in advance through an experiment or the like and be stored in the control unit 24 for each of the diameter or the material of the used wire 50.

If the third step is completed, the control unit 24 executes a looping operation in which the wire 50 is drawn out to the second bonding point P2. Specifically, if the last pressing operation is completed, the control unit 24 causes the capillary 12 to move in the forward direction at the pressing height H3 (trajectory 1 in FIG. 4) and then to move upward (trajectory m in FIG. 4), and a bending habit is imparted to the wire 50. Thereafter, the control unit 24 causes the capillary 12 to move in an obliquely downward direction toward the second bonding point P2.

If the capillary 12 arrives at the second bonding point P2, the control unit 24 causes the capillary 12 to descend toward the second bonding point P2 and causes the wire 50 to be pressed to the lead 122. At this time, as necessary, ultrasonic vibration is applied to the capillary 12. Due to this pressing, a stitch bond which becomes the second bonded part 58 is formed at the second bonding point P2 (lead 122). In this state, the control unit 24 causes the capillary 12 to slightly rise and then causes the clamper 21 to be closed. Further, the capillary 12 is laterally moved in a state in which the clamper 21 is closed such that the wire 50 is torn off.

As is obvious in the foregoing description, in the wire bonding apparatus 10 disclosed in the present specification, after the pressure bonded ball 60 and the column part 62 is formed, the column part 62 positioned over the pressure bonded ball 60 is scraped off by causing the capillary 12 to horizontally move at the pressure bonding height H1. Moreover, after the column part 62 is scraped off, the wire 50 folded over the pressure bonded ball 60 is pressed down using the capillary 12. Accordingly, not only the thickness of the first bonded part 54 can be drastically reduced, but also the loop height HL of the wire loop can be drastically reduced.

Figures 7, 8:
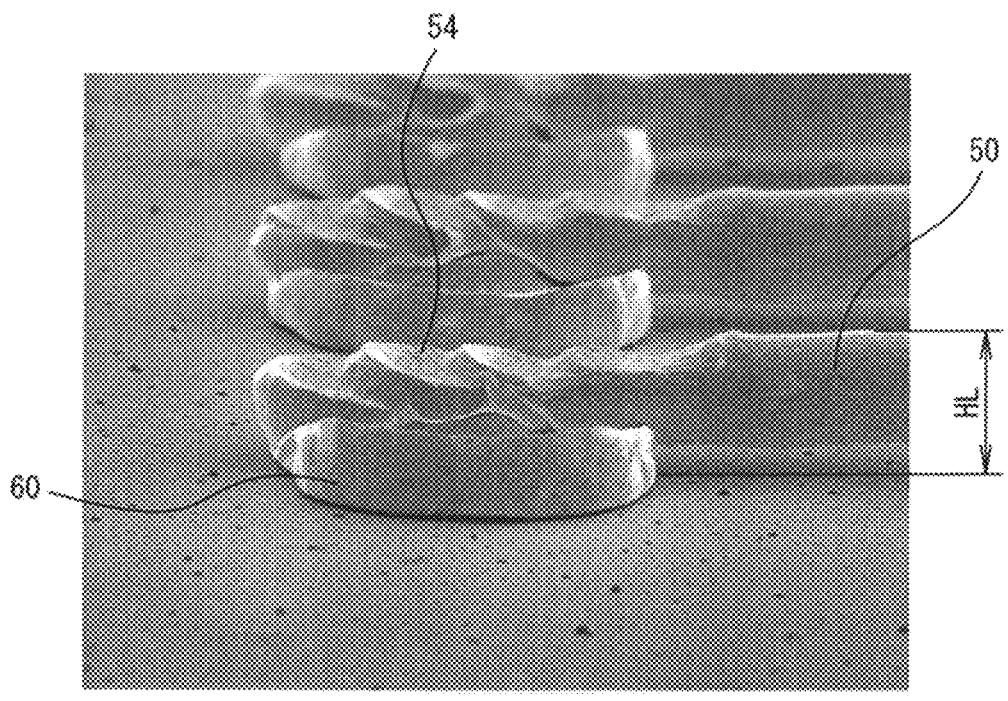
FIG. 7 is a table showing experimental results.
FIG. 8 is a photograph showing an example of the first bonded part formed by the technology disclosed in the present specification.

FIG. 7 is a table showing experimental results of wire bonding performed by the wire bonding apparatus 10 disclosed in the present specification. In the experiment, 30 wire loops were formed using a gold wire ($\varphi$=18 μm), and the thickness Bt, the loop height HL, and the pull strength of the pressure bonded ball 60 were measured for each wire loop.

As illustrated in FIG. 7, according to the technology disclosed in the present specification, the thickness Bt of the pressure bonded ball 60 is within a range of 6.6 μm to 7.2 μm (average thickness of 6.9 μm), and the loop height HL is within a range of 19.8 μm to 21.5 μm (average thickness of 20.5 μm). On the other hand, as described above, the loop height HL in the technology in the related art illustrated in FIG. 10 approximately corresponds to the total value of the thickness of the pressure bonded ball 60 and the wire diameter. In the case of $\varphi$=18 μm, it is approximately 25 μm. Namely, according to the technology disclosed in the present specification, compared to the technology in the related art illustrated in FIG. 10, the loop height HL can be reduced approximately 20%. In addition, as illustrated in FIG. 7, it can be ascertained that the pull strengths of the wire loops are within a range of 2.0 gf to 2.4 gf and the wire loops are low loops and have sufficient strengths.

FIG. 8 is an image showing an example of the first bonded part 54 formed by the technology disclosed in the present specification. As illustrated in FIG. 8, in the first bonded part 54 of the present example, a portion of the wire 50 crushed toward the pressure bonded ball 60 at a predetermined interval is placed on the pressure bonded ball 60 having a flat disk shape. In addition, it can be ascertained that the wire 50 is substantially horizontally drawn out from the forward side end part of the pressure bonded ball 60 and the loop height HL is restricted to approximately 1.1 to 1.2 times the wire diameter $\varphi$.

Next, a flow in which a movement sequence of the capillary 12 is automatically generated by the control unit 24 will be described. As described above, the control unit 24 automatically generates a movement sequence of the capillary 12. In order to automatically generate this movement sequence, an operator inputs at least size information of the capillary 12, wire information, and size information of the pressure bonded ball 60 in advance. Here, the size information of the capillary 12 includes dimension values of respective parts at the tip part of the capillary 12, that is, the hole diameter H, the chamfer diameter CD, an outer diameter T, the facing width W, and the like. In addition, in place of such dimension values of respective parts, an operator may input only identification information (for example, a model number) of the capillary 12. In this case, the control unit 24 stores a plurality of kinds of dimension values of the capillary 12 in association with the identification information in advance and identifies the dimension values of the actually using capillary 12 based on the identification information input from an operator.

The wire information includes the diameter, the material, and the like of a used wire. In addition, the size information of the pressure bonded ball 60 includes target values for a diameter D and the thickness Bt of the pressure bonded ball 60 to be formed. The control unit 24 may automatically calculate the target values for the diameter D and the thickness Bt of the pressure bonded ball 60 based on other information. For example, the control unit 24 may store the diameter D and the thickness Bt of the pressure bonded ball 60, which can be formed, for each of the shape of the using capillary 12 and the diameter of the wire, and the control unit 24 may automatically identify the diameter D and the thickness Bt of the pressure bonded ball 60 from the size information of the capillary 12 and the wire information input from an operator.

In addition, before a sequence is generated, the control unit 24 also acquires positional information of the first bonding point P1 and the second bonding point P2, that is, positional information of the pad 112 of the semiconductor chip 110 and the lead of the lead frame 120. Such positional information may be input by an operator or may be automatically acquired by the control unit 24. That is, for example, a camera moving together with the said bonding arm 14 may be provided in the vicinity of the bonding arm 14, and the control unit 24 may calculate the positions the first bonding point P1 and the second bonding point P2 based on an image captured by the said camera.

If these pieces of information can be acquired, the control unit 24 calculates a movement position of the capillary 12 for each movement trajectory. Here, particularly, calculation of the movement positions in the trajectories b to k for forming the first bonded part 54 will be described. The control unit 24 calculates the heights H1 to H3, horizontal movement amount Lb and L1 to L3, and the like for calculating the movement positions of the capillary 12.

Specifically, the control unit 24 calculates the pressure bonding height H1 that is a distance from the upper surface of the pad 112 to the lower end of the capillary 12 in the first step (at the time of forming the pressure bonded ball 60 and the column part 62) from the thickness Bt of the pressure bonded ball 60. In addition, in the third step, the control unit 24 determines the movement height H2 that is a height when the capillary 12 is horizontally moved based on the kind (the diameter, the material, or the like) of the wire 50. Moreover, in the third step, the control unit 24 determines the pressing height H3 that is a height when the wire 50 is pressed down using the capillary 12 based on the kinds (the diameters or the materials) of the pressure bonding height H1 and the wire 50. That is, the pressing height H3 has a value obtained by adding the margin ΔH determined based on the kind of the wire 50 to the pressure bonding height H1.

Moreover, the control unit 24 determines the horizontal movement distance Lb in the second step based on the largest diameter (that is, the chamfer diameter CD) of the column part 62. In addition, the control unit 24 calculates the number N of times of a pressing operation in the third step and the horizontal intervals L1 to LN of a pressing operation based on the shape of the capillary 12 and the shape of the pressure bonded ball 60. These values N and L1 to LN are set such that the wire 50 placed on the pressure bonded ball 60 can be thoroughly pressed down by the facing surface 44 of the capillary 12.

If the heights H1 to H3 of the respective trajectories and the horizontal movement amounts Lb and L1 to LN can be calculated, the control unit 24 combines these values, positional information of the first bonding point P1 and the second bonding point P2, and the like, and generates a movement sequence of the capillary 12.

As is obvious in the foregoing description, according to the wire bonding apparatus 10 disclosed in the present specification, wire loops in which the loop height HL is reduced can be formed. In addition, according to the wire bonding apparatus 10 disclosed in the present specification, a movement sequence of the capillary 12 capable of realizing such low loops can be automatically generated based on the shape information of the capillary 12, the wire information, and the shape information of the pressure bonded ball 60. Accordingly, trouble of an operator can be reduced.

The constitutions which have been described up to now are examples. As long as the control unit 24 executing at least the first process (first step) in which the pressure bonded ball 60 and the column part 62 are formed, the second process (second step) in which the capillary 12 is horizontally moved to scrape the column part 62, and the third process (third step) in which a pressing operation is performed at least once during movement of the capillary 12 in the forward direction is provided, other constitutions may be suitably changed.

The invention claimed is:

1. A method for manufacture of a semiconductor device by connecting a first bonding point and a second bonding point to each other with a wire using a capillary, the method comprising:
  a first step in which, after a free air ball is formed at a tip of the wire inserted through the capillary, the capillary descends to a prescribed pressure bonding height toward the first bonding point to deform the free air ball formed at a tip of the wire into a pressure bonded ball and a column part positioned over the pressure bonded ball at the first bonding point, wherein the prescribed pressure bonding height is determined based on a thickness of the pressure bonded ball;
  a second step in which the column part is scraped off using the capillary by making the capillary move horizontally without rising at the pressure bonding height after execution of the first step; and
  a third step in which the capillary is moved in a forward direction that is a direction of approaching the second bonding point at a movement height higher than the pressure bonding height and the wire is folded back without being cut, and a pressing operation for causing the capillary to ascend and descend such that a wire portion overlapping the pressure bonded ball is pressed down using the capillary is repeated at least once during movement after execution of the second step.

* * * * *